United States Patent
Hong et al.

(10) Patent No.: US 11,450,360 B2
(45) Date of Patent: *Sep. 20, 2022

(54) RESISTIVE MEMORY DEVICE FOR LOWERING RESISTANCE VALUE OF MEMORY CELL DURING SET PROGRAM OPERATION

(71) Applicant: SK hynix Inc., Icheon (KR)

(72) Inventors: Seok-Man Hong, Icheon (KR); Myoung-Sub Kim, Icheon (KR); Tae-Hoon Kim, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/119,821

(22) Filed: Dec. 11, 2020

(65) Prior Publication Data

US 2021/0098036 A1 Apr. 1, 2021

Related U.S. Application Data

(63) Continuation-in-part of application No. 16/378,926, filed on Apr. 9, 2019, now Pat. No. 10,878,904.

(30) Foreign Application Priority Data

Aug. 24, 2018 (KR) .................... 10-2018-0099210

(51) Int. Cl.
*G11C 7/22* (2006.01)
*G11C 7/10* (2006.01)
*G11C 13/00* (2006.01)

(52) U.S. Cl.
CPC .............. *G11C 7/1096* (2013.01); *G11C 7/22* (2013.01); *G11C 13/0004* (2013.01); *G11C 13/0069* (2013.01)

(58) Field of Classification Search
CPC ............ G11C 13/0069; G11C 13/0061; G11C 2013/0083; G11C 2013/0078;
(Continued)

(56) References Cited

U.S. PATENT DOCUMENTS

2006/0220071 A1* 10/2006 Kang ................. G11C 13/0004 257/248
2008/0151613 A1* 6/2008 Chao .................. G11C 13/0004 365/163

(Continued)

FOREIGN PATENT DOCUMENTS

KR 1020120138643 12/2012

OTHER PUBLICATIONS

Burr et al., "Observation and modeling of polycrystalline grain formation in Ge2Sb2Te5", Journal of Applied Physics, May 21, 2012, 12 pages, American Institute of Physics, U.S.A.

*Primary Examiner* — Mushfique Siddique (57) ABSTRACT

An electronic device includes a semiconductor memory. The semiconductor memory includes a write circuit and a memory cell. The write circuit is suitable for generating a first write current having a lower level than a melting current and a second write current having a higher level than the melting current during a set program operation. The memory cell is suitable for storing a data value corresponding to a write data signal, based on the first and second write currents.

15 Claims, 8 Drawing Sheets

(58) Field of Classification Search
CPC ............ G11C 11/1655; G11C 11/1693; G11C 13/0026; G11C 2013/0092; G11C 13/0004; G11C 13/0007; G11C 11/1675; G11C 7/22
See application file for complete search history.

(56) References Cited

U.S. PATENT DOCUMENTS

| | | | |
|---|---|---|---|
| 2010/0124090 A1* | 5/2010 | Arai | G11C 13/0061 365/51 |
| 2011/0051508 A1* | 3/2011 | Eleftheriou | G11C 11/5678 365/163 |

* cited by examiner

RESISTIVE MEMORY DEVICE FOR LOWERING RESISTANCE VALUE OF MEMORY CELL DURING SET PROGRAM OPERATION

CROSS-REFERENCE TO RELATED APPLICATIONS

The present application is a continuation-in-part application of U.S. patent application Ser. No. 16/378,926 filed on Apr. 9, 2019, which claims priority to Korean Patent Application No. 10-2018-0099210 filed on Aug. 24, 2018. The disclosure of each of the foregoing applications is herein incorporated herein by reference in its entirety.

TECHNICAL FIELD

This patent document relates to memory circuits, memory devices, and their applications in electronic devices or systems.

BACKGROUND

Recently, as electronic appliances trend toward miniaturization, low power consumption, high performance, multi-functionality, and so on, semiconductor devices capable of storing information in various electronic appliances such as computers, portable communication devices, and so on, have been demanded. Such semiconductor devices include semiconductor devices that have a variable resistance characteristic, i.e., semiconductor devices that can store data by switching between different resistance states according to an applied voltage or current. Such semiconductor devices include, for example, an RRAM (resistive random access memory), a PRAM (phase change random access memory), an FRAM (ferroelectric random access memory), an MRAM (magnetic random access memory), an E-fuse, etc. As a semiconductor device is smaller and operates with low power, a resistance margin between a low resistance state and a high resistance state becomes smaller. Therefore, an error may occur in detecting data stored in a memory cell because of the smaller resistance margin, and thus operational reliability of the semiconductor device becomes lower. To overcome the drawback, the semiconductor memory device needs to increase the resistance margin. For the purpose, it is required to control a memory cell to have a lower resistance value when it is in the low resistance state. In addition, it is required to reduce a time taken for setting the low resistance state of the memory cell.

SUMMARY

The disclosed technology in this patent document includes memory circuits and memory devices, as well as their applications in electronic devices and systems. The disclosed technology also includes various implementations of an electronic device, which controls a memory cell to have a lower resistance value during a write mode, e.g., a set program operation.

In an implementation, there is provided an electronic device including a semiconductor memory. The semiconductor memory may include: a write circuit suitable for generating a first write current having a lower level than a melting current and a second write current having a higher level than the melting current during a set program operation; and a memory cell suitable for storing a data value corresponding to a write data signal, based on the first and second write currents.

The first write current may be generated according to a condition for generating a crystal seed corresponding to a crystal fraction of 0.1% by the memory cell. The first write current may have an amplitude corresponding to ⅔ of an amplitude of the second write current. The first write current may have a width corresponding to 10 ns. The write circuit may generate the first write current at a first time point corresponding to a pre-write latency shorter than a write latency, and generate the second write current at a second time point corresponding to the write latency, based on a write command signal, the write data signal and a latency information signal. The write circuit may include: a first circuit suitable for generating a pre-set current in response to a pre-set enable signal; a second circuit suitable for generating a set current in response to a set enable signal; a third circuit suitable for generating a reset current in response to a reset enable signal; and a fourth circuit suitable for generating the first write current corresponding to the pre-set current, and generating the second write current corresponding to any one of the set current and the reset current. The write circuit may further include: a first write control unit suitable for generating the pre-set enable signal based on a write command signal and a latency information signal; and a second write control unit suitable for generating the set enable signal and the reset enable signal based on the write data signal. The first circuit may include a first current source for generating the pre-set current, the second circuit may include a second current source for generating the set current, the third circuit may include a third current source for generating the reset current, and the fourth circuit may include a current mirror for generating the first write current by mirroring the pre-set current and generating the second write current by mirroring any one of the set current and the reset current. The first write current may be generated for a first time, the second write current may be generated for a second time, and the first time may be shorter than the second time.

In an implementation, there is provided an electronic device including a semiconductor memory. The semiconductor memory may include: a write circuit suitable for generating first and second write currents having a lower level than a melting current during a set program operation; and a memory cell suitable for storing a data value corresponding to a write data signal, based on the first and second write currents.

The first write current may be generated according to a condition for generating a crystal seed corresponding to a crystal fraction of 0.1% by the memory cell. The first write current may have a width corresponding to 10 ns. The first write current may be generated for a first time, the second write current may be generated for a second time, and the first time may be shorter than the second time. The write circuit may generate the first write current at a first time point corresponding to a pre-write latency shorter than a write latency, and generate the second write current at a second time point corresponding to the write latency, based on a write command signal, the write data signal and a latency information signal. The write circuit may include: a first circuit suitable for generating a pre-set current in response to a pre-set enable signal; a second circuit suitable for generating a set current in response to a set enable signal; a third circuit suitable for generating a reset current in response to a reset enable signal; and a fourth circuit suitable for generating the first write current corresponding to the pre-set current, and generating the second write current corresponding to any one of the set current and the reset current. The write circuit may further include: a first write control unit suitable for generating the pre-set enable signal based on a write command signal and a latency information signal; and a second write control unit suitable for generating the set enable signal and the reset enable signal based on the write data signal. The first circuit may include a first current source for generating the pre-set current, the second circuit may include a second current source for generating the set current, the third circuit may include a third current source for generating the reset current, and the fourth circuit may include a current mirror for generating the first write current by mirroring the pre-set current and generating the second write current by mirroring any one of the set current and the reset current.

DETAILED DESCRIPTION

Various examples and implementations of the disclosed technology are described below, in detail, with reference to the accompanying drawings.

The present disclosure may, however, be embodied in different forms and should not be construed as limited to the implementations set forth herein. Rather, these implementations are provided so that this disclosure will be thorough and complete, and will fully convey the scope of various implementations of the present disclosure to those skilled in the art. Throughout the disclosure, like reference numerals refer to like parts throughout the various figures and implementations of the present disclosure.

A semiconductor memory device in accordance with implementations of the disclosed technology may include a variable resistance element that exhibits a variable resistance characteristic, i.e., a variable resistance element that represents different digital bits or states by exhibiting different resistance values. In implementations, such a variable resistance element may include a single-layer or a multi-layer structure exhibiting the variable resistance characteristic, and may include any of a material used in a RRAM, PRAM, STTRAM, MRAM, or FRAM (e.g., a ferromagnetic material); a ferroelectric material; a phase change material, such as a chalcogenide material; a metal oxide, such as a perovskite material; and a transition metal oxide.

The variable resistance element may include a metal oxide, a perovskite material, or both. The metal oxide may include a transition metal oxide, such as a nickel (Ni) oxide, a titanium oxide (TiO), a hafnium oxide (HfO), a zirconium oxide (ZrO), a tungsten oxide (WO), or a cobalt oxide (CoO). The perovskite material may include a material such as a strontium titanium oxide (STO:SrTiO) or a praseodymium calcium manganese oxide (PCMO:PrCaMnO).

Moreover, the variable resistance element may include a phase change material. The phase change material may include a chalcogenide material, such as germanium-antimony-tellurium (GST:GeSbTe). The variable resistance element switches between different resistance states by changing its structure into a crystalline state or an amorphous state according to heat applied to the phase change material.

The variable resistance element may include two magnetic layers and a tunnel barrier layer interposed between the two magnetic layers. The magnetic layer may include any of nickel-iron-cobalt (NiFeCo), Cobalt-iron (CoFe), etc. The tunnel barrier layer may include aluminum oxide ($Al_2O_3$). The variable resistance element may switch between two different resistance states according to magnetization directions of the two magnetic layers. For example, the variable resistance element may be in a low resistance state when the magnetization directions of the two magnetic layers are parallel, and may be in a high resistance state when the magnetization directions of the two magnetic layers are anti-parallel.

Figure 1:
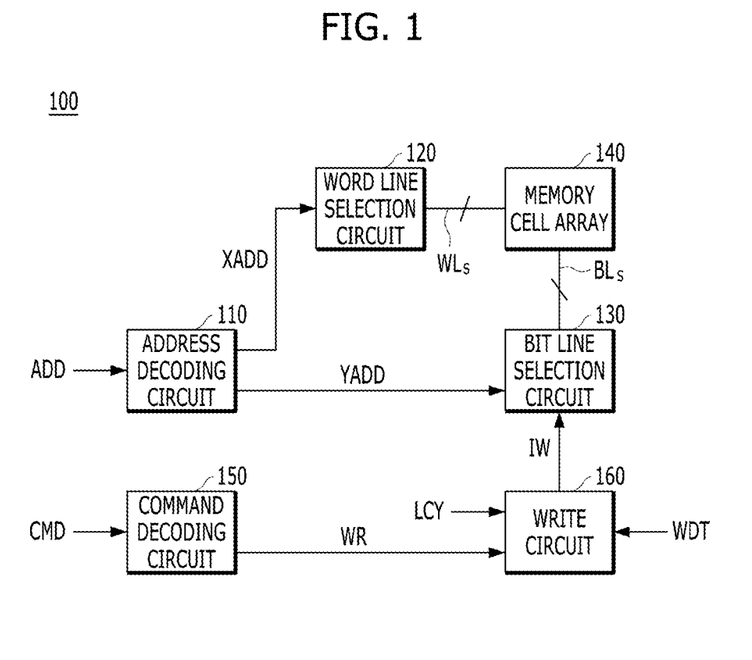
FIG. 1 is a block diagram illustrating a memory device in accordance with an implementation of the present disclosure.

FIG. 1 is a block diagram illustrating a memory device 100 in accordance with an implementation of the present disclosure.

Referring to FIG. 1, the memory device 100 may include an address decoding circuit 110, a word line selection circuit 120, a bit line selection circuit 130, a memory cell array 140, a command decoding circuit 150, and a write circuit 160.

The address decoding circuit 110 may generate a row address signal XADD and a column address signal YADD based on an address signal ADD inputted from a control device (not illustrated).

The word line selection circuit 120 may select one of a plurality of word lines WLs based on the row address signal XADD. For example, the word line selection circuit 120 may couple the selected word line WL to a low voltage terminal, for example, a ground voltage terminal.

The bit line selection circuit 130 may select one of a plurality of bit lines BLs based on the column address signal YADD. For example, the bit line selection circuit 130 may transfer a write current IW to the selected bit line BL.

The memory cell array 140 may be coupled between the word lines WLs and the bit lines BLs. The memory cell array 140 may include a plurality of memory cells (not illustrated) coupled to the respective intersections between the word lines WLs and the bit lines BLs.

For example, each of the memory cells may include a variable resistance element and a selection element.

The variable resistance element of the memory cell may have a high resistance state or low resistance state according to a logic value, i.e., a data value of data stored therein. The high resistance state may be referred to as a reset state. The low resistance state may be referred to as a set state. For example, the variable resistance element may include a phase-change material. When the variable resistance element includes the phase-change material, the variable resistance element may have a crystalline state according to a set program operation or an amorphous state according to a reset program operation.

For example, when a set current having a slow quenching pattern (that is, a trapezoidal wave pattern) is applied to the variable resistance element, the variable resistance element may be melted and then gradually and slowly cooled down. Consequently, the variable resistance element has the low resistance state, i.e., the crystalline state. Alternatively, the variable resistance element may not be melted and have a low resistance state, which is a crystalline state, by maintaining a relatively low crystal temperature for a specific time by the set current having a square wave pattern. On the other hand, when a reset current having a fast quenching pattern is applied to the variable resistance element, the variable resistance element may be melted and then rapidly cooled down. Consequently, the variable resistance element has the high resistance state, i.e., the amorphous state.

In an implementation, a crystal seed may be generated in the variable resistance element using a pre-set current. The pre-set current may be inputted to the variable resistance element before the set current is inputted to the variable resistance element during the set program operation. The set program operation in the variable resistance element may be accelerated by the crystal seed when the variable resistance element is programmed to have the crystalline state using the set current, such that, in the low resistance state, the variable resistance element may have a lower resistance value than a variable resistance element to which the pre-set current is not inputted.

The selection element of the memory cell may be turned on due to a voltage difference between both ends of the memory cell. For example, the selection element may include any of a diode, a Schottky diode, an ovonic threshold switch (OTS), a metal insulator transistor (MIT), a mixed ion-electron conducting (MIET) device, and so on.

In a write mode, the command decoding circuit 150 may generate a write command signal WR representing the write mode based on a command signal CMD inputted from the control device. The write mode may include the set program operation and the reset program operation.

The write circuit 160 may generate the write current IW based on the write command signal WR, a write data signal WDT, and a latency information signal LCY. For example, the write circuit 160 may generate the write current IW at a first point of time corresponding to pre-write latency PWL during a first period of time, and generate the write current IW at a second point of time corresponding to write latency WL during a second period of time. The first period of time may be shorter than the second period of time. Hereinafter, the write current IW generated at the first point of time during the first period of time may be referred to as a first write current IW1, and the write current IW generated at the second point of time during the second period of time may be referred to as a second write current IW2. The pre-write latency PWL may be shorter than the write latency WL. The first period of time may be shorter than the second period of time. Generating the first write current IW1 and the second write current IW2 based on the pre-write latency PWL and the write latency WL will be described below with reference to FIG. 4.

Figure 2:
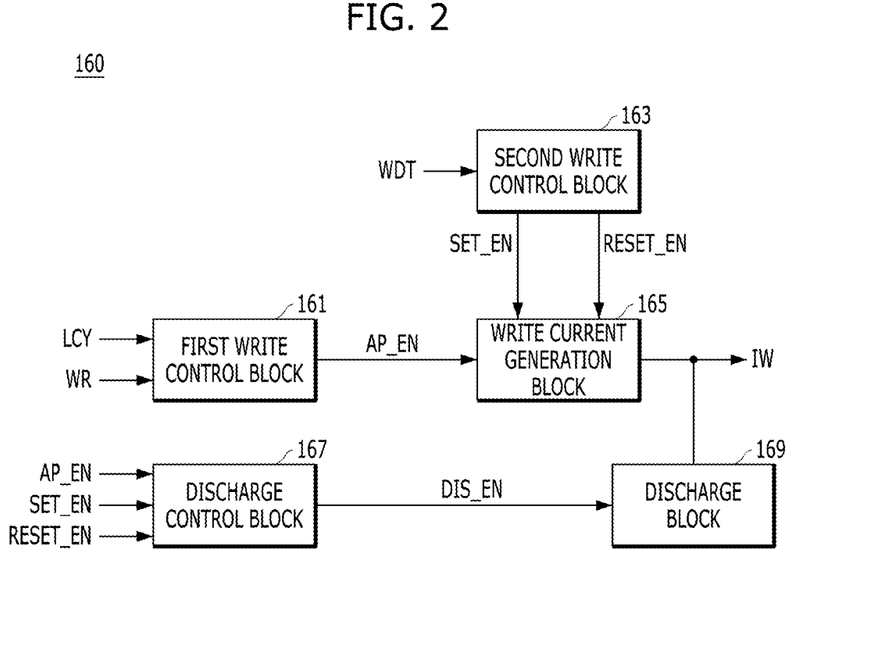
FIG. 2 is a block diagram illustrating a write circuit shown in FIG. 1 according to an implementation of the present disclosure.

FIG. 2 is a block diagram illustrating the write circuit 160 shown in FIG. 1 according to an implementation.

Referring to FIG. 2, the write circuit 160 may include a first write control block 161, a second write control block 163, a write current generation block 165, a discharge control block 167, and a discharge block 169.

The first write control block 161 may generate a pre-set enable signal AP_EN at the first point of time corresponding to the pre-write latency PWL based on the write command signal WR and the latency information signal LCY.

The second write control block 163 may generate one of a set enable signal SET_EN and a reset enable signal RESET_EN at the second point of time corresponding to the write latency WL based on the write data signal WDT.

The write current generation block 165 may generate the first write current IW1 at the first point of time and generate the second write current IW2 at the second point of time, based on the pre-set enable signal AP_EN, the set enable signal SET_EN, and the reset enable signal RESET_EN.

The discharge control block 167 may generate a discharge control signal DIS_EN based on the pre-set enable signal AP_EN, the set enable signal SET_EN, and the reset enable signal RESET_EN. For example, the discharge control block 167 may include any of an edge trigger, a pulse generator, and so on.

The discharge block 169 may discharge the write current IW based on the discharge control signal DIS_EN. For example, the discharge block 169 may include a switching element coupled between an output terminal of the write current IW and the ground voltage terminal.

Figure 3:
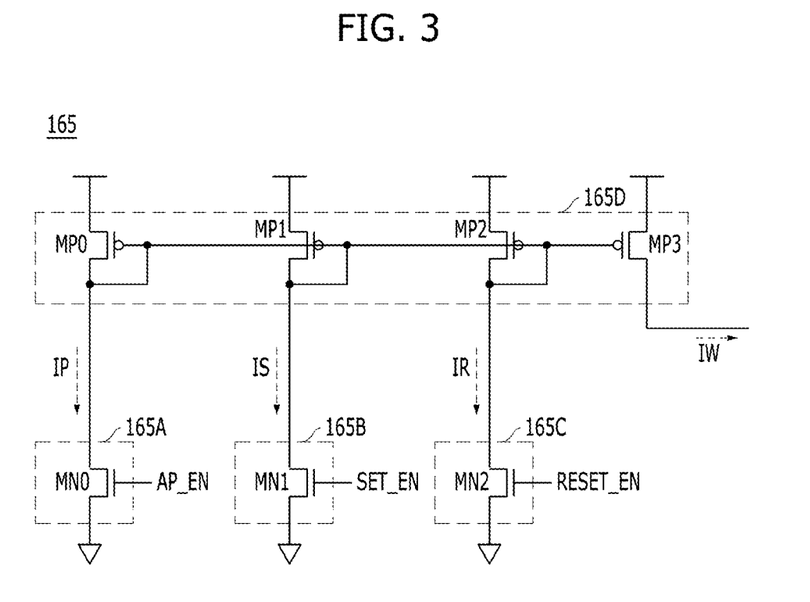
FIG. 3 is a circuit diagram illustrating a write current generation block shown in FIG. 2 according to an implementation of the present disclosure.

FIG. 3 is a circuit diagram illustrating the write current generation block 165 shown in FIG. 2 according to an implementation.

Referring to FIG. 3, the write current generation block 165 may include a first current source 165A, a second current source 165B, a third current source 165C, and a current mirror 165D.

The first current source 165A may generate a pre-set current IP in response to the pre-set enable signal AP_EN. The pre-set current IP may have a short pulse shape. For example, the pre-set current IP may be generated during the first period of time, and the amplitude of the pre-set current IP may be the same as or different from the amplitude of a set current IS, which is to be described below.

The second current source 165B may generate the set current IS in response to the set enable signal SET_EN. The set current IS may be the set current having the slow quenching pattern.

The third current source 165C may generate a reset current IR in response to the reset enable signal RESET_EN. The reset current IR may be the reset current having the fast quenching pattern.

The current mirror 165D may generate the first write current IW1 by mirroring the pre-set current IP, and generate the second write current IW2 by mirroring one of the set current IS and the reset current IR.

Hereinafter, an operation of the memory device 100 having the aforementioned configuration shown in FIGS. 1 and 2 will be described with reference to FIG. 4. In an implementation, an operation according to the write mode, particularly, the set program operation, will be described.

Figure 4:
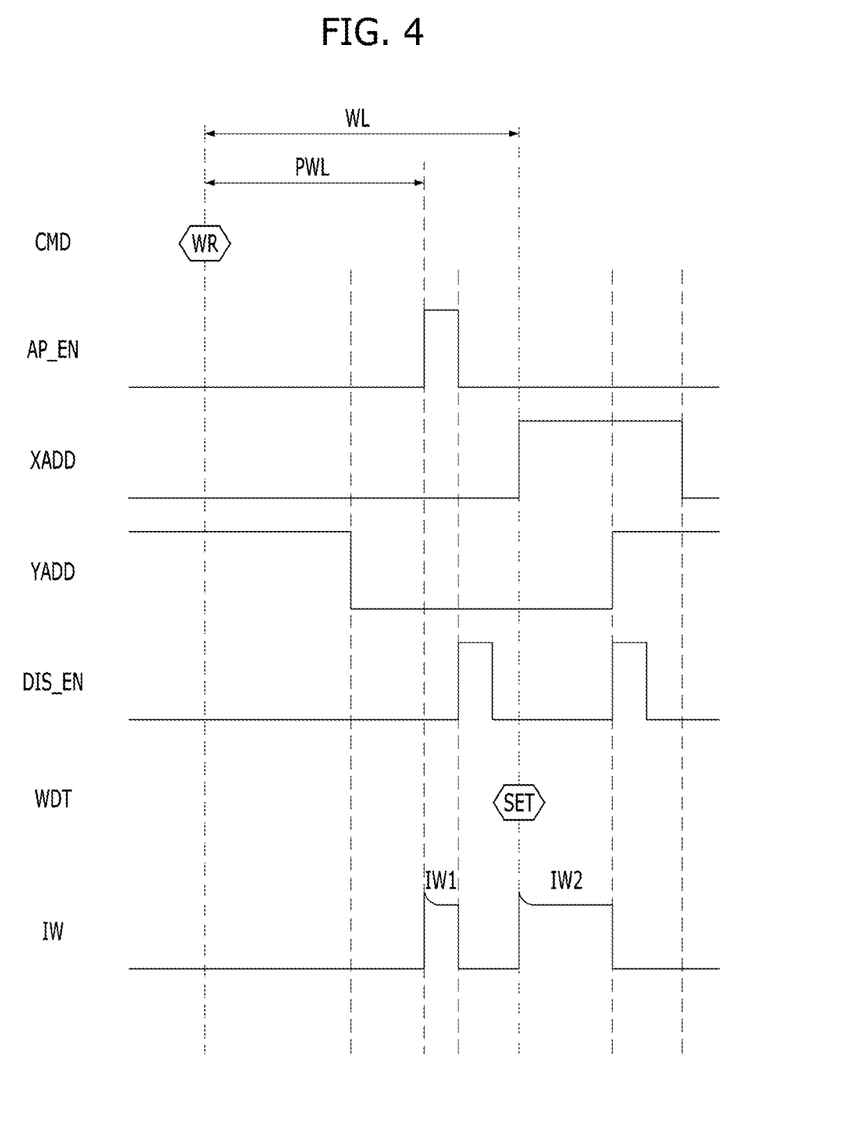
FIG. 4 is a timing diagram of describing an operation of the memory device shown in FIG. 1.

FIG. 4 is a timing diagram for describing a driving operation of the memory device 100 according to the set program operation.

Referring to FIGS. 1 and 4, the address decoding circuit 110 may generate the row address signal XADD and the column address signal YADD based on the address signal ADD. The word line selection circuit 120 may select one of the word lines WLs based on the row address signal XADD. The bit line selection circuit 130 may select one of the bit lines BLs based on the column address signal YADD. Accordingly, one memory cell of the memory cells included in the memory cell array 140 may be selected, the selected memory cell being coupled to the selected word line and the selected bit line.

The command decoding circuit 150 may generate the write command signal WR based on the command signal CMD.

The write circuit 160 may generate, as the write current IW, the first write current IW1 at a point of time corresponding to an ending point of the pre-write latency PWL based on the write command signal WR and the latency information signal LCY. The write circuit 160 may generate, as the write current IW, the second write current IW2 at a point of time corresponding to an ending point of the write latency WL based on the write data signal WDT.

The write latency WL may include a period of time ranging from a point of time when the command signal CMD corresponding to the write command signal WR is inputted to the memory device 100 to a point of time when the write data signal WDT is inputted to the memory device 100. The pre-write latency PWL may include a period of time ranging from the point of time when the command signal CMD corresponding to the write command signal WR is inputted to the memory device 100 to a predetermined point of time. The predetermined point of time may be earlier than the point of time when the write data signal WDT is inputted to the memory device 100. Accordingly, the pre-write latency PWL may be shorter than the write latency WL.

The first and second write currents IW1 and IW2 may be provided to the selected memory cell of the memory cells included in the memory cell array 140. The set program operation may be primarily performed on the selected memory cell according to the first write current IW1 and secondarily performed on the selected memory cell according to the second write current IW2. For example, the variable resistance element included in the selected memory cell may generate the crystal seed when the first write current IW1 is applied thereto. Subsequently, when the second write current IW2 is applied to the variable resistance element, the set program operation for the variable resistance element may be accelerated by the crystal seed, such that the variable resistance element may achieve the low resistance state having a lower resistance value than a variable resistance element not having a crystal seed.

Meanwhile, an operation of the write circuit 160 shown in FIG. 1 will be described in detail below with reference to FIGS. 2 to 4.

The first write control block 161 may generate the pre-set enable signal AP_EN at a point of time corresponding to the ending point of the pre-write latency PWL based on the write command signal WR and the latency information signal LCY. The write current generation block 165 may generate, as the write current IW, the first write current IW1 corresponding to the pre-set current IP in response to the pre-set enable signal AP_EN. The first write current IW1 may be provided to the selected memory cell through the bit line selection circuit 130 of FIG. 1.

The second write control block 163 may generate the set enable signal SET_EN at a point of time corresponding to the ending point of the write latency WL based on the write data signal WDT. The write current generation block 165 may generate, as the write current IW, the second write current IW2 corresponding to the set current IS in response to the set enable signal SET_EN. The second write current IW2 may be provided to the selected memory cell through the bit line selection circuit 130.

Although not illustrated, the pre-set enable signal AP_EN and the first write current IW1 may be generated during the reset program operation, but they do not exert a bad influence on the reset program operation.

Figure 5:
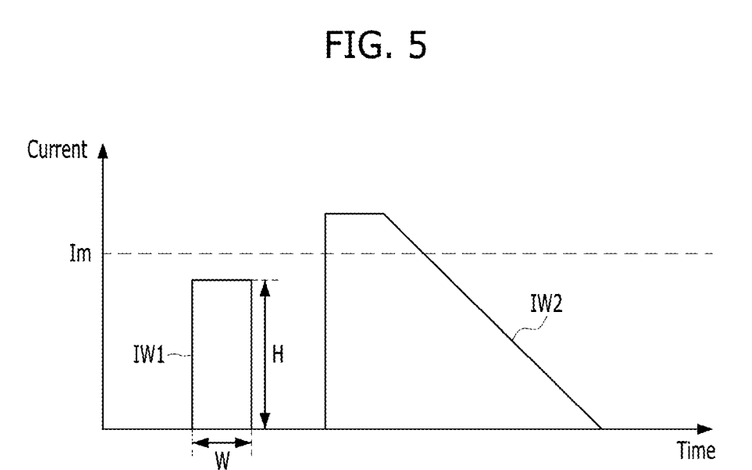
FIG. 5 is a graph of an example of a first write current and a second write current shown in FIG. 4.

FIG. 5 is a graph illustrating the first write current IW1 and the second write current IW2 shown in FIG. 4 according to an example.

Referring to FIG. 5, the first write current IW1 may have a lower level than the second write current IW2. The second write current IW2 may have a higher level than a melting current Im, and the first write current IW1 may have a lower level than the melting current Im. If the first write current IW1 has a level equal to or greater than a level of the melting current Im, the first write current IW1 may be applied as the reset current IR instead of the pre-set current IP. Therefore, it is preferable that the first write current IW1 has a lower level than the melting current Im. The second write current IW2 may be generated to have the trapezoidal wave pattern. For example, the second write current IW2 may be generated in the form of a pulse wave that rises steeply and then gradually falls to correspond to the slow quenching pattern. The first write current IW1 may have a square wave pattern. In particular, the first write current IW1 may be generated so that a crystal seed is generated to correspond to a crystal fraction of 0.1%. For example, the first write current IW1 may have an amplitude H corresponding to ⅔ or less of an amplitude (or height) of the second write current IW2, and have a width W equal to or greater than 10 ns and less than a width of the second write current IW2.

Figure 6:
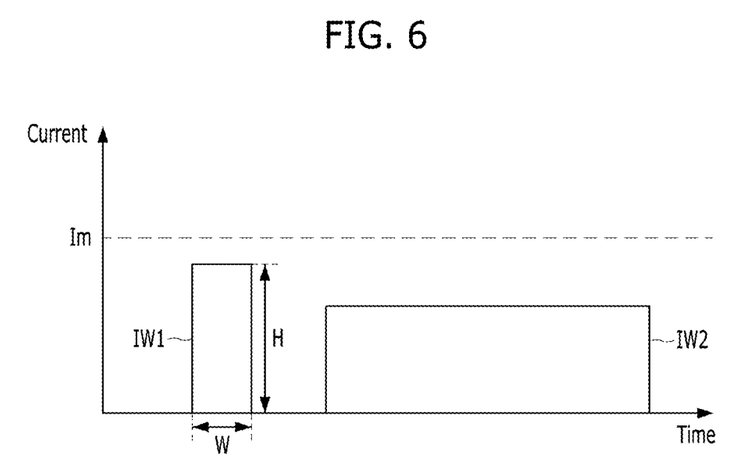
FIG. 6 is a graph of another example of the first write current and the second write current shown in FIG. 4.

FIG. 6 is a graph illustrating the first write current IW1 and the second write current IW2 shown in FIG. 4 according to another example.

Referring to FIG. 6, the second write current IW2 may have a lower level than the melting current Im. The second write current IW2 may be generated to have a square wave pattern. The second write current IW2 may have the lower level than the melting current Im, but may be generated to maintain a constant level for a longer time than the second write current IW2 shown in FIG. 5. The first write current IW1 may be generated to have a square wave pattern. In particular, the first write current IW1 may be generated so that a crystal seed is generated to correspond to a crystal fraction of 0.1%. For example, the first write current IW1 may have a lower level than the melting current Im, have a higher amplitude (or height) H than the second write current IW2, and have a width W equal to or greater than 10 ns and less than a width of the second write current IW2. For reference, if the first write current IW1 has a higher level than the melting current Im, the first write current IW1 may be applied as the reset current IR, not the pre-set current IP. Therefore, it is preferable that the first write current IW1 has the lower level than the melting current Im.

As is apparent from the above descriptions, the semiconductor device in accordance with the implementation may sequentially provide first and second write currents to a selected memory cell during a set program operation, such that a variable resistance element included in the selected memory cell may be controlled to have a lower resistance value. Furthermore, the semiconductor device may generate the first write current at a point of time corresponding to an ending point of the pre-write latency, which is shorter than the write latency, thereby minimizing a time required for the set program operation. In addition, the semiconductor device may stably perform the set program operation by generating the optimized first write current.

According to the implementation described above, a memory cell has a lower resistance value when a set program operation is performed using first and second write currents, thereby improving the operational reliability of the semiconductor device.

The above and other memory circuits or semiconductor devices based on the disclosed technology may be used in a range of devices or systems. FIGS. 7-11 provide some examples of devices or systems that may implement memory circuits disclosed herein.

Figure 7:
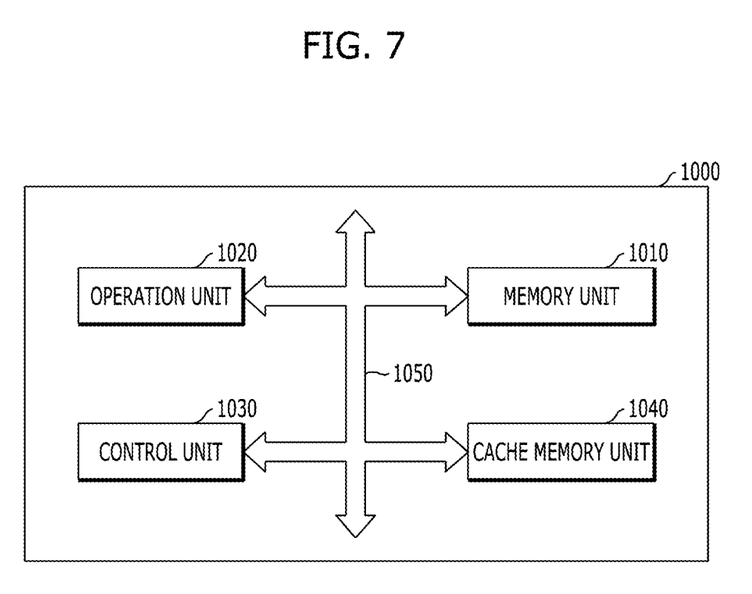
FIG. 7 is an example of a configuration diagram of a microprocessor implementing memory circuitry based on an implementation of the disclosed technology.

FIG. 7 is an example of a configuration diagram of a microprocessor 1000 implementing memory circuitry based on the disclosed technology.

Referring to FIG. 7, the microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a write circuit suitable for generating a first write current at a first point of time corresponding to pre-write latency that is shorter than write latency and generating a second write current at a second point of time corresponding to the write latency, based on a write command signal, a write data signal, and a latency information signal; and a memory cell array suitable for storing a data value corresponding to the write data signal based on the first and second write currents.

Alternatively, the memory unit 1010 may include a write circuit for generating a first write current having a lower level than a melting current and a second write current having a higher level than the melting current during a set program operation, and a memory cell for storing a data value corresponding to a write data signal, based on the first and second write currents. Through this, characteristics of the memory unit 1010 may be improved. As a consequence, performance characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
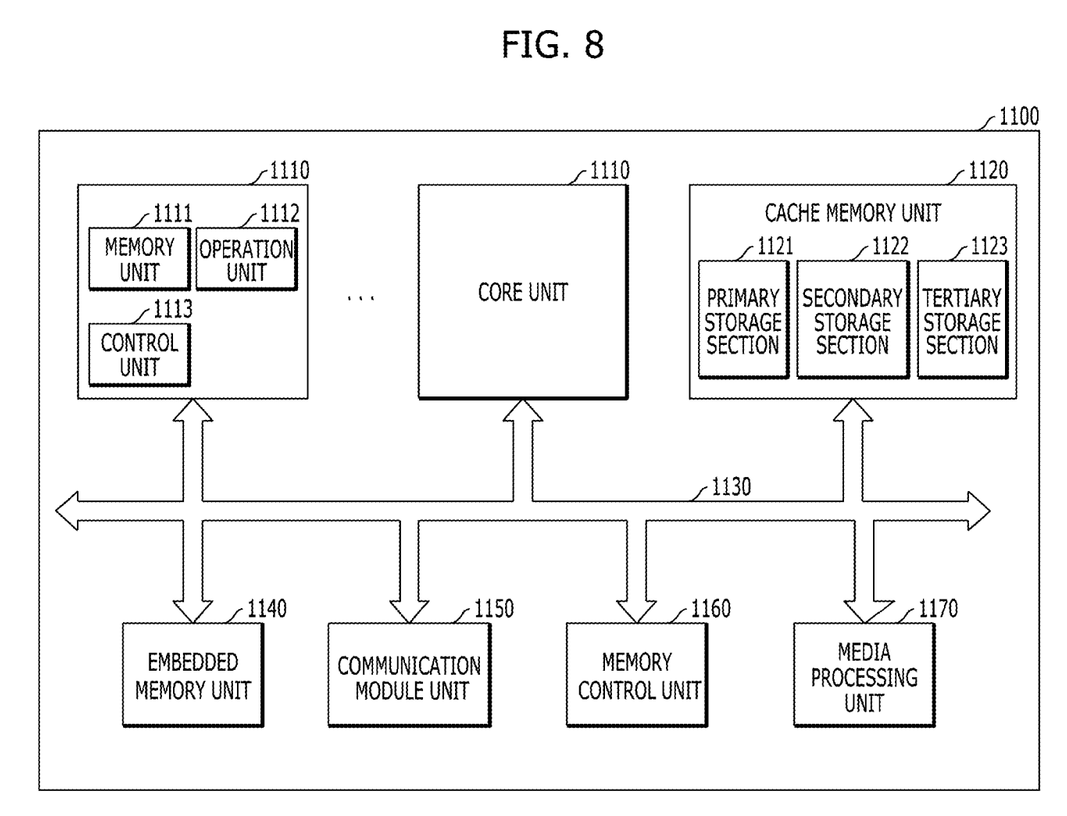
FIG. 8 is an example of a configuration diagram of a processor implementing memory circuitry based on an implementation of the disclosed technology.

FIG. 8 is an example of a configuration diagram of a processor 1100 implementing memory circuitry based on the disclosed technology.

Referring to FIG. 8, the processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a write circuit suitable for generating a first write current at a first point of time corresponding to pre-write latency that is shorter than write latency and generating a second write current at a second point of time corresponding to the write latency, based on a write command signal, a write data signal, and a latency information signal; and a memory cell array suitable for storing a data value corresponding to the write data signal based on the first and second write currents.

Alternatively, the cache memory unit 1120 may include a write circuit for generating a first write current having a lower level than a melting current and a second write current having a higher level than the melting current during a set program operation, and a memory cell for storing a data value corresponding to a write data signal, based on the first and second write currents. Through this, characteristics of the cache memory unit 1120 may be improved. As a consequence, performance characteristics of the processor 1100 may be improved.

Although it was shown in FIG. 8 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
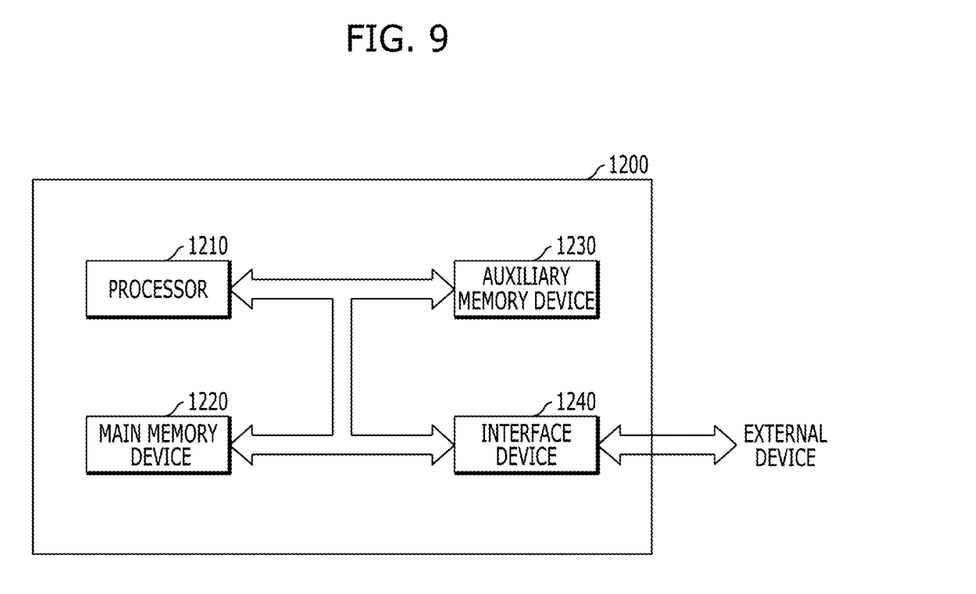
FIG. 9 is an example of a configuration diagram of a system implementing memory circuitry based on an implementation of the disclosed technology.

FIG. 9 is an example of a configuration diagram of a system 1200 implementing memory circuitry based on the disclosed technology.

Referring to FIG. 9, the system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which may temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a write circuit suitable for generating a first write current at a first point of time corresponding to pre-write latency that is shorter than write latency and generating a second write current at a second point of time corresponding to the write latency, based on a write command signal, a write data signal, and a latency information signal; and a memory cell array suitable for storing a data value corresponding to the write data signal based on the first and second write currents.

Alternatively, the main memory device 1220 may include a write circuit for generating a first write current having a lower level than a melting current and a second write current having a higher level than the melting current during a set program operation, and a memory cell for storing a data value corresponding to a write data signal, based on the first and second write currents. Through this, characteristics of the main memory device 1220 may be improved. As a consequence, performance characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a write circuit suitable for generating a first write current at a first point of time corresponding to pre-write latency that is shorter than write latency and generating a second write current at a second point of time corresponding to the write latency, based on a write command signal, a write data signal, and a latency information signal; and a memory cell array suitable for storing a data value corresponding to the write data signal based on the first and second write currents.

Alternatively, the auxiliary memory device 1230 may include a write circuit for generating a first write current having a lower level than a melting current and a second write current having a higher level than the melting current during a set program operation, and a memory cell for storing a data value corresponding to a write data signal, based on the first and second write currents. Through this, characteristics of the auxiliary memory device 1230 may be improved. As a consequence, performance characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
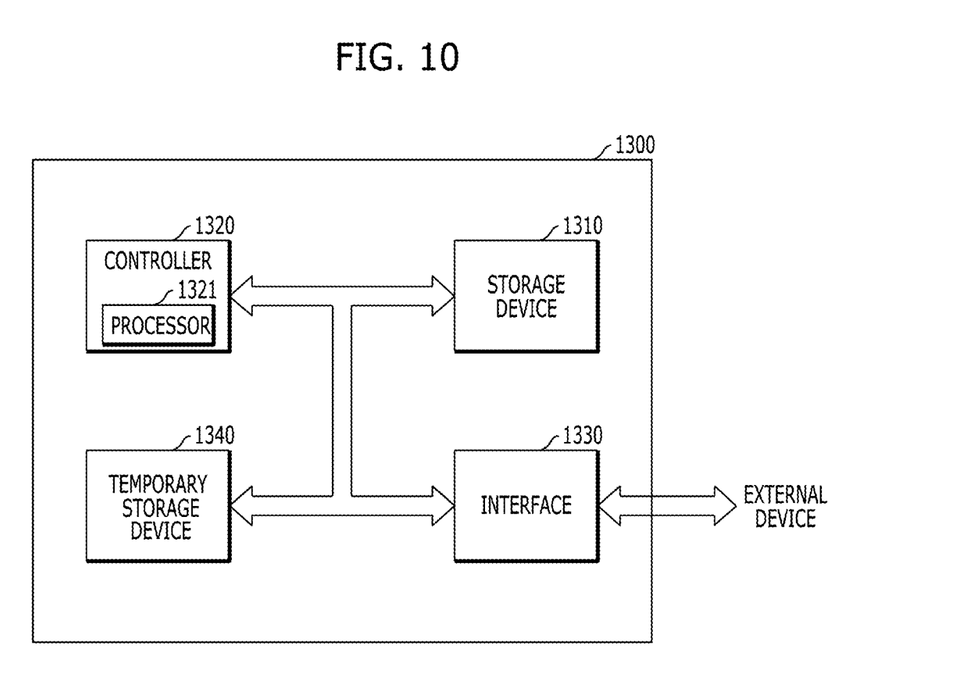
FIG. 10 is an example of a configuration diagram of a data storage system implementing memory circuitry based on an implementation of the disclosed technology.

FIG. 10 is an example of a configuration diagram of a data storage system 1300 implementing memory circuitry based on the disclosed technology.

Referring to FIG. 10, the data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above-mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. For example, the temporary storage device 1340 may include a write circuit suitable for generating a first write current at a first point of time corresponding to pre-write latency that is shorter than write latency and generating a second write current at a second point of time corresponding to the write latency, based on a write command signal, a write data signal, and a latency information signal; and a memory cell array suitable for storing a data value corresponding to the write data signal based on the first and second write currents.

Alternatively, the temporary storage device 1340 may include a write circuit for generating a first write current having a lower level than a melting current and a second write current having a higher level than the melting current during a set program operation, and a memory cell for storing a data value corresponding to a write data signal, based on the first and second write currents. Through this, characteristics of the temporary storage device 1340 may be improved. As a consequence, performance characteristics of the system 1300 may be improved.

Figure 11:
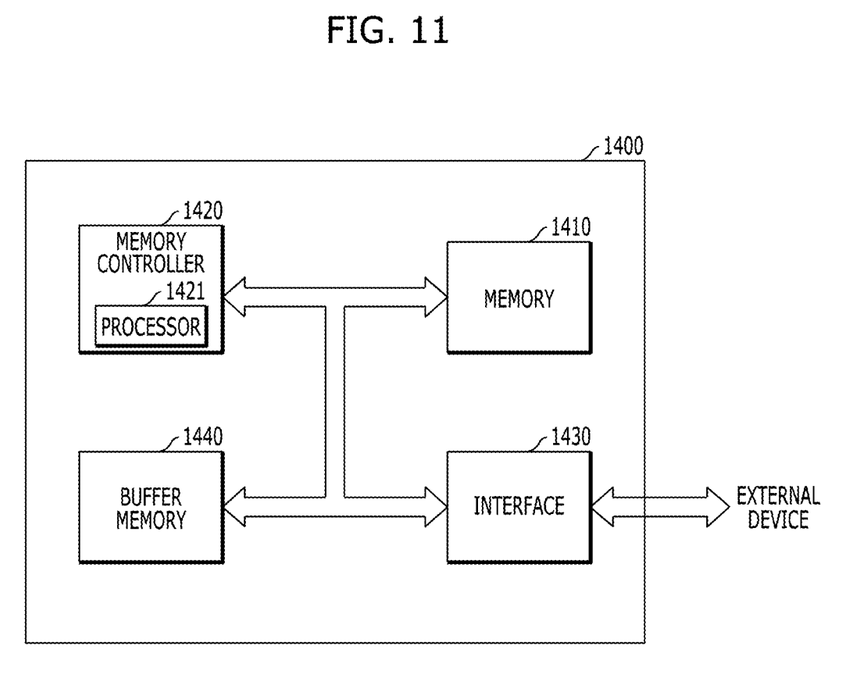
FIG. 11 is an example of a configuration diagram of a memory system implementing memory circuitry based on an implementation of the disclosed technology.

FIG. 11 is an example of a configuration diagram of a memory system 1400 implementing memory circuitry based on the disclosed technology.

Referring to FIG. 11, the memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a write circuit suitable for generating a first write current at a first point of time corresponding to pre-write latency that is shorter than write latency and generating a second write current at a second point of time corresponding to the write latency, based on a write command signal, a write data signal, and a latency information signal; and a memory cell array suitable for storing a data value corresponding to the write data signal based on the first and second write currents.

Alternatively, the memory 1410 may include a write circuit for generating a first write current having a lower level than a melting current and a second write current having a higher level than the melting current during a set program operation, and a memory cell for storing a data value corresponding to a write data signal, based on the first and second write currents. Through this, characteristics of the memory 1410 may be improved. As a consequence, performance characteristics of the memory system 1400 may be improved.

Through this, the performance of the memory system 1400 may be improved by performing a stable sense and amplification operation.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a write circuit suitable for generating a first write current at a first point of time corresponding to pre-write latency that is shorter than write latency and generating a second write current at a second point of time corresponding to the write latency, based on a write command signal, a write data signal, and a latency information signal; and a memory cell array suitable for storing a data value corresponding to the write data signal based on the first and second write currents.

Alternatively, the buffer memory 1440 may include a write circuit for generating a first write current having a lower level than a melting current and a second write current having a higher level than the melting current during a set program operation, and a memory cell for storing a data value corresponding to a write data signal, based on the first and second write currents. Through this, characteristics of the buffer memory 1440 may be improved. As a consequence, performance characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, initializing a resistance variable element is easy, and it is possible to secure reliable characteristics of the resistance variable element.

Features in the above examples of electronic devices or systems in FIGS. 7-11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular implementations of particular inventions. Certain features that are described in this patent document in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the implementations described in this patent document should not be understood as requiring such separation in all implementations.

Only a few implementations and examples are described. Other implementations, enhancements and variations can be made based on what is described and illustrated in this patent document.

What is claimed is:

1. An electronic device including a semiconductor memory, wherein the semiconductor memory includes:
    a write circuit configured to generate a first write current having a lower level than a melting current and a second write current having a higher level than the melting current during a set program operation; and
    a memory cell configured to store a data value corresponding to a write data signal, based on the first and second write currents,
    wherein the write circuit generates the first write current at a first time point corresponding to a pre-write latency that is shorter than a write latency, and generates the second write current at a second time point corresponding to the write latency, based on a write command signal, the write data signal, and a latency information signal.

2. The electronic device according to claim 1, wherein the write circuit generates the first write current according to a condition for generating a crystal seed corresponding to a crystal fraction of 0.1% by the memory cell.

3. The electronic device according to claim 1, wherein the first write current has an amplitude corresponding to about ⅔ of an amplitude of the second write current.

4. The electronic device according to claim 1, wherein the first write current has a width corresponding to about 10 ns.

5. The electronic device according to claim 1, wherein the write circuit includes:
   a first circuit configured to generate a pre-set current in response to a pre-set enable signal;
   a second circuit configured to generate a set current in response to a set enable signal;
   a third circuit configured to generate a reset current in response to a reset enable signal; and
   a fourth circuit configured to generate the first write current corresponding to the pre-set current, and generate the second write current corresponding to one of the set current and the reset current.

6. The electronic device according to claim 5, wherein the write circuit further includes:
   a first write control unit configured to generate the pre-set enable signal based on a write command signal and a latency information signal; and
   a second write control unit configured to generate the set enable signal and the reset enable signal based on the write data signal.

7. The electronic device according to claim 5, wherein the first circuit includes a first current source for generating the pre-set current,
   the second circuit includes a second current source for generating the set current,
   the third circuit includes a third current source for generating the reset current, and
   the fourth circuit includes a current mirror for generating the first write current by mirroring the pre-set current and generating the second write current by mirroring the one of the set current and the reset current.

8. The electronic device according to claim 1, wherein the first write current is generated for a first time period,
   the second write current is generated for a second time period, and
   the first time period is shorter than the second time period.

9. An electronic device including a semiconductor memory, wherein the semiconductor memory includes:
   a write circuit configured to generate first and second write currents each having a lower level than a melting current during a set program operation; and
   a memory cell configured to store a data value corresponding to a write data signal, based on the first and second write currents,
   wherein the write circuit generates the first write current at a first time point corresponding to a pre-write latency that is shorter than a write latency, and generates the second write current at a second time point corresponding to the write latency, based on a write command signal, the write data signal, and a latency information signal.

10. The electronic device according to claim 9, wherein the write circuit generates the first write current according to a condition for generating a crystal seed corresponding to a crystal fraction of 0.1% by the memory cell.

11. The electronic device according to claim 9, wherein the first write current has a width corresponding to about 10 ns.

12. The electronic device according to claim 9, wherein the first write current is generated for a first time period,
   the second write current is generated for a second time period, and
   the first time period is shorter than the second time period.

13. The electronic device according to claim 9, wherein the write circuit includes:
   a first circuit configured to generate a pre-set current in response to a pre-set enable signal;
   a second circuit configured to generate a set current in response to a set enable signal;
   a third circuit configured to generate a reset current in response to a reset enable signal; and
   a fourth circuit configured to generate the first write current corresponding to the pre-set current, and generate the second write current corresponding to one of the set current and the reset current.

14. The electronic device according to claim 13, wherein the write circuit further includes:
   a first write control unit configured to generate the pre-set enable signal based on a write command signal and a latency information signal; and
   a second write control unit configured to generate the set enable signal and the reset enable signal based on the write data signal.

15. The electronic device according to claim 13, wherein the first circuit includes a first current source for generating the pre-set current,
   the second circuit includes a second current source for generating the set current,
   the third circuit includes a third current source for generating the reset current, and the fourth circuit includes a current mirror for generating the first write current by mirroring the pre-set current and generating the second write current by mirroring the one of the set current and the reset current.

* * * * *